United States Patent [19]

Kato

[11] Patent Number: 6,001,534

[45] Date of Patent: Dec. 14, 1999

[54] PHOTOSENSITIVE RESIN COMPOSITION

[75] Inventor: Hideto Kato, Takasaki, Japan

[73] Assignee: Shin-Etsu Chemical Co., Ltd., Tokyo, Japan

[21] Appl. No.: 09/050,071

[22] Filed: Mar. 30, 1998

[30] Foreign Application Priority Data

Mar. 31, 1997 [JP] Japan ................................. 9-096581

[51] Int. Cl.$^6$ .................................................. G03C 1/725
[52] U.S. Cl. ........................ 430/283.1; 522/99; 522/148; 522/149
[58] Field of Search ........................... 430/283.1; 522/99, 522/148, 149

[56] References Cited

U.S. PATENT DOCUMENTS

| | | | |
|---|---|---|---|
| 4,778,859 | 10/1988 | Ai et al. | 525/421 |
| 5,616,448 | 4/1997 | Kato | 430/283.1 |
| 5,866,627 | 2/1999 | Czornyj et al. | 522/18 |

FOREIGN PATENT DOCUMENTS

| | | |
|---|---|---|
| 60-72925 | 4/1985 | Japan . |
| 61-59334 | 3/1986 | Japan . |
| 62-275129 | 11/1987 | Japan . |
| 10195294 | 7/1988 | Japan . |
| 06073003 | 3/1994 | Japan . |

*Primary Examiner*—Janet Baxter
*Assistant Examiner*—Barbara Gilmore
*Attorney, Agent, or Firm*—Oblon, Spivak, McClelland, Maier & Neustadt, P.C.

[57] ABSTRACT

A photosensitive resin composition is comprised of (A) a polyimide resin having a weight-average molecular weight of from 5,000 to 150,000, represented by the general formula (I):

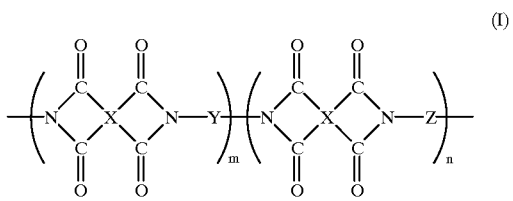

wherein X is a specified tetravalent organic group having two benzene rings, Y is a member comprised of 30–100 mol % of a specific organic group having two benzene rings and 70–0 mol % of another specific divalent aromatic organic group, Z is a divalent organic group represented by the general formula (VI):

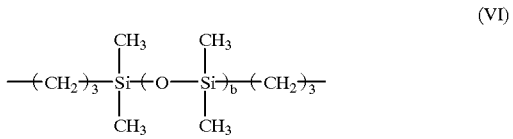

wherein b is an integer of 5 to 80; and m and n each represent a number satisfying that m/(m+n) is 0.98 to 0.70 and n/(m+n) is 0.02 to 0.30; (B) an agent selected from a sensitizer and a photopolymerization initiator; and (C) an organic solvent. From this composition, polyimide films having a superior adhesion to substrates and also having no corrosive properties can be formed by low-temperature heat treatment.

5 Claims, No Drawings

PHOTOSENSITIVE RESIN COMPOSITION

BACKGROUND OF THE INVENTION

1. Field of the Invention

This invention relates to a photosensitive resin composition, and more particularly to a photosensitive resin composition useful as materials for forming protective insulating films for semiconductor devices, orientation films for liquid-crystal display devices, insulating films for multi-layer printed-circuit boards.

2. Description of the Prior Art

What have been hitherto proposed as heat-resistant photosensitive materials are exemplified by a material comprising polyamic acid and dichromate [Japanese Patent Publication (kokoku) No. 49-17374 corresponding to U.S. Pat. No. 3,623,870], a material comprising a polyamic acid into the carboxylic acid of which a photosensitive group has been introduced through an ester linkage [Japanese Pre-examination Patent Publication (kokai) Nos. 49-115541 corresponding to U.S. Pat. No. 3,957,512 and 55-45746], a material comprising polyamic acid and an amine compound having a photosensitive group [Japanese Pre-examination Patent Publication (kokai) 54-145794 corresponding to U.S. Pat. No. 4,243,743], a material comprising a polyamic acid into the carboxylic acid of which a photosensitive group has been introduced through a silyl ester linkage [Japanese Pre-examination Patent Publication (kokai) No. 62-275129].

Since, however, these materials are polyimide resin precursors (polyamic acids), the precursors are exposed to light to form a pattern and thereafter the pattern must be heated usually at a temperature higher than 300° C. Accordingly, substrates on which these materials are used are limited to those capable of withstanding such a high temperature.

Meanwhile, a photosensitive resin comprising polyimide as a base skeleton is proposed which is exemplified by a negative photosensitive resin into the polyimide skeleton of which a photopolymerizable functional group has been introduced (Japanese Pre-examination Patent Publication (kokai) Nos. 60-72925 and 61-59334), or a positive photosensitive resin composition comprised of a polyimide, which has a phenolic hydroxyl group, and a diazonaphthoquinone [Japanese Pre-examination Patent Publication (kokai) No. 3-209478 corresponding to U.S. Pat. No. 5,288,5881] is proposed.

However, films formed on substrates by using the photosensitive polyimide resin have no sufficient adhesion to the substrates. Also, corrosive ions may remain in the photosensitive polyimide resin films or in films having been cured, to cause, e.g., corrosion of metals. Hence, this greatly comes into question when the photosensitive polyimide resin is used in electronic materials.

SUMMARY OF THE INVENTION

Accordingly, an object of the present invention is to provide a photosensitive resin composition from which a polyimide film having a superior adhesion to substrates and also having no corrosive properties can be formed by low-temperature heat treatment after pattern formation.

As a result of extensive studies made earnestly on the above problems, the present inventor has discovered that the problems can be solved by a specific photosensitive resin composition as described below.

The present invention provides a photosensitive resin composition comprising;

(A) a polyimide resin having a weight-average molecular weight of from 5,000 to 150,000, represented by the general formula (I):

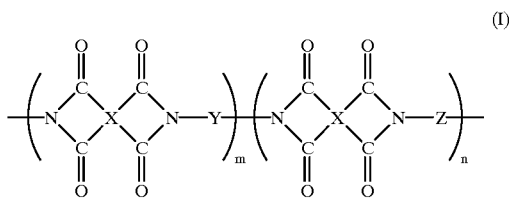

wherein X is at least one tetravalent organic group selected from the group consisting of groups represented by the following formulas (II-1) to (II-4):

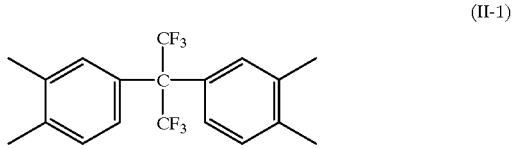

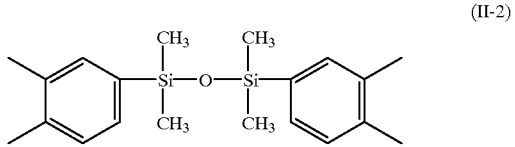

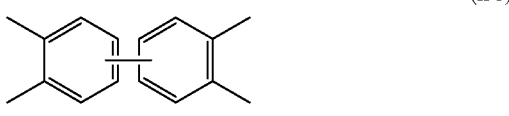

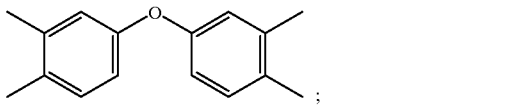

Y is a group comprised of 1) from 30 to 100 mol % of a divalent organic group represented by the general formula (III):

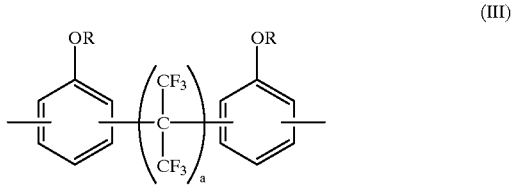

wherein a is an integer of 0 or 1, R's are independently an acryloyl group, a methacryloyl group or a hydrogen atom, provided that 50 mol % or more of the whole R's is at least one group selected from the group consisting of the acryloyl group and the methacryloyl group, and 2) from 70 to 0 mol % of a divalent organic group represented by the general formula (IV):

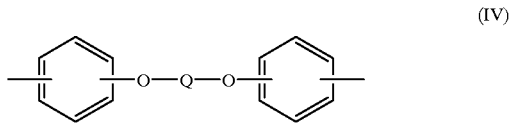

wherein Q is a divalent organic group selected from the group consisting of groups represented by the following formulas (V-1) to (V-3):

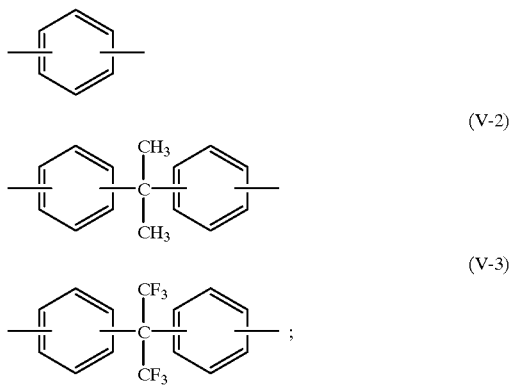

Z is a divalent organic group represented by the following general formula (VI):

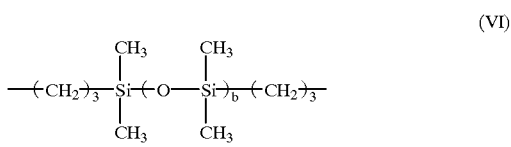

wherein b is an integer of 5 to 80; and m and n each represent the number of structural units to which the m and n are attached respectively, provided that m/(m+n) is 0.98 to 0.70 and n/(m+n) is 0.02 to 0.30;

(B) an agent selected from the group consisting of a sensitizer and a photopolymerization initiator; and (C) an organic solvent.

The photosensitive resin composition of the present invention has a good sensitivity also when thick films are formed, can provide a good pattern after development, and also can be formed into a polyimide film having a superior adhesion to substrates, by heat treatment at a low temperature. Thus, the present composition can be suitably used as materials for forming electronic-part films such as protective insulating films for semiconductor devices, orientation films for liquid-crystal display devices, and insulating films for multi-layer printed-circuit boards.

DESCRIPTION OF THE PREFERRED EMBODIMENTS

The photosensitive resin composition of the present invention will be described below in detail.

(A) Polyimide Resin

The polyimide resin of component (A) is a prepolymer represented by the general formula (I).

In the formula, X is a tetravalent organic group selected from the group consisting of groups represented by the formulas (II-1) to (II-4). Any of these groups may be present alone or in combination of two or more thereof.

Y is a group comprised of 1) a divalent organic group having two benzene rings represented by the general formula (III) and 2) a divalent organic group having 3 or 4 benzene rings represented by the general formula (IV). In the whole Y groups, the organic group of the general formula (III) is held in a proportion of from 30 to 100 mol %, and preferably from 50 to 100 mol %. Thus, the proportion of the organic group of the general formula (IV) held in the whole Y groups is the balance, i.e., from 70 to 0 mol %, and preferably from 50 to 0 mol %. If the organic group of the general formula (III) is in a proportion less than 30 mol %, no sufficient photosensitive properties (photopolymerizability) may be exhibited.

In the whole R-groups in the the general formula (III), the group selected from the group consisting of an acryloyl group and a methacryloyl group is held in a proportion of 50% or more, and preferably from 70 to 100 mol %. If this is in a proportion less than 50 mol %, no sufficient photosensitive properties (photopolymerizability) may also be exhibited.

As examples of the organic group of the general formula (III), it may include radicals formed by removing two amino groups from 3,3'-dihydroxy-4,4'-diaminobiphenyl, 2,2-bis(3-hydroxy-4-aminophenyl)-1,1,1,3,3,3-hexafluoropropane or the like; and groups formed by substituting part or the whole of the hydrogen atoms of the phenolic hydroxyl group of any of these radicals with the acryloyl (i.e., $CH_2=CHCO-$) or the methacryloyl (i.e., $CH_2=C(CH_3)CO-$) group. Any of these may be used alone or in combination of two or more thereof.

As examples of the organic group of the general formula (IV), it may include radicals formed by removing two amino groups from 1,4-bis(3-aminophenoxy)benzene, 1,4-bis(4-aminophenoxy)benzene, 2,2-bis[4-(4-aminophenoxy)phenyl]propane, 2,2-bis[4-(4-aminophenoxy)phenyl]perfluoropropane or the like. Any of these may be used alone or in combination of two or more thereof.

In the general formula (I), Z is a divalent organic group represented by the general formula (VI), having a siloxane linkage. The value b is an integer of from 5 to 80, and preferably from 7 to 75. If the value b is smaller than 5, polyimide films having been formed may have so high an elasticity as to have a low adhesion after film formation. If on the other hand it is larger than 80, siloxane components may separate to give no copolymers. The divalent organic group represented by the general formula (VI) may also be used alone or in combination of two or more thereof.

In the general formula (I), m is a number satisfying that m/(m+n) is 0.98 to 0.70, preferably from 0.98 to 0.85; and n is a number satisfying that n/(m+n) is 0.02 to 0.30, preferably from 0.02 to 0.15.

The polyimide resin (A) can be synthesized in the following way, for example:

First, a tetracarboxylic dianhydride represented by the formula (10):

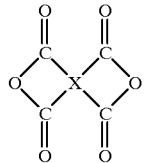

wherein X is as defined above;

a diamine compound (70 to 98 mol % of the total of diamines) represented by the formula (11):

wherein Y is as defined above, provided that R is a hydrogen atom;

and a diamine compound (the balance, i.e., 30 to 2 mol % of the total of diamines) represented by the formula (12):

wherein Z is as defined above;

are subjected to cyclization polycondensation by a known method to synthesize the polyimide resin having a phenolic hydroxyl group.

Stated specifically, the tetracarboxylic dianhydride of the formula (10) and the diamine compounds of the formulas (11) and (12) are dissolved in a solvent in an inert atmosphere, and these are allowed to react at generally from 10 to 40° C., and preferably from 10 to 30° C. to form polyamic acid, the precursor of the polyimide resin. Next, the temperature of the polyamic acid obtained is raised to 100 to 200° C., and preferably 150 to 200° C., to dehydrate and ring closure the acid amide moiety of the polyamic acid.

The above solvent may include, e.g., N-methyl-2-pyrrolidone, dimethylacetamide, dimethylformamide, hexamethylphosphoramide, tetrahydrofuran, 1,4-dioxane, methyl cellosolve, butyl cellosolve, diethylene glycol dimethyl ether, diethylene glycol diethyl ether, triethylene glycol dimethyl ether, acetone, methyl ethyl ketone, methyl isobutyl ketone, cyclopentanone, cyclohexanone, γ-butyrolactone, butyl cellosolve acetate, toluene, xylene, anisole, methyl anisole and ethyl phenyl ether. Among them, N-methyl-2-pyrrolidone, γ-butyrolactone and cyclohexanone are preferred. Any of these may be used alone or in combination of two or more thereof.

Subsequently, the polyimide resin having a phenolic hydroxyl group thus obtained and an acryloyl or methacryloyl halide such as acryloyl or methacryloyl chloride are esterified in the presence of a dehydrochlorination accelerator to obtain the polyimide resin (A). Herein, the reaction may be carried out at normal temperature of generally from 10 to 40° C., and preferably from 20 to 30° C.

The tetracarboxylic dianhydride of the formula (10) used in the above reaction may include those represented by the following formulas (VII-1) to (VII-4):

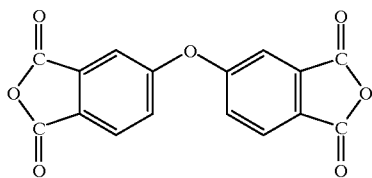
(VII-1)

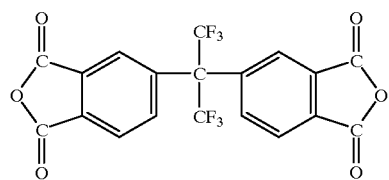
(VII-2)

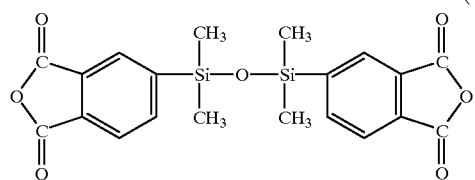
(VII-3)

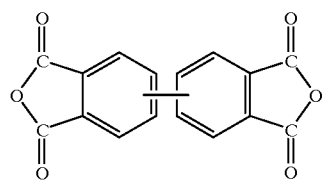
(VII-4)

Any of these may be used alone or in combination of two or more thereof.

The diamine compound of the formula (11) may include those represented by the following formulas (VIII-1) and (VIII-2):

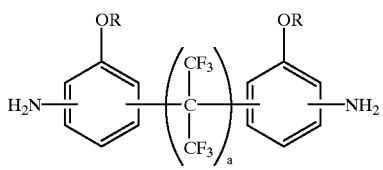
(VIII-1)

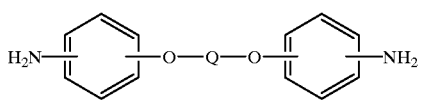
(VIII-2)

wherein R is a hydrogen atom, and a and Q are as defined above. Any of these may be used alone or in combination of two or more thereof.

The polyimide resin (A) thus obtained has a weight-average molecular weight of from 5,000 to 150,000, and preferably from 20,000 to 150,000, in terms of polystyrene. If it has a weight-average molecular weight smaller than 5,000, no sufficient film strength may be exhibited after film formation. If on the other hand it has a weight-average molecular weight larger than 150,000, the solution may have so high a viscosity as to have poor coating properties.

(B) Sensitizer and/or Photopolymerization Initiator

The component (B) of the present invention is at least one agent selected from the group consisting of a sensitizer and a photopolymerization initiator. Any known agents used in photocurable resin compositions may be used without any particular limitations.

The sensitizer may include, e.g., ethyl 4-diethylaminoenzoate, benzophenone, acetophenone, anthrone, phenanthrene, nitrofluorene, nitroacenaphthene, p,p'-tetramethyldiaminobenzophenone, p,p'-tetraethyldiaminobenzophenone, chlorothioxanthone, benzanthraquinone, 2,6-bis(4-diethylaminobenzal)-cyclohexanone, 2,6-bis(4-diethylaminobenzal)-4-methylcyclohexanone, 4,4'-bis(diethylamino)chalcone, 2,4-diethylthioxanthone, N-phenyl-diethanolamine, diethylaminoethyl methacrylate, coumarin compound benzyl [e.g., carbonylbis (diethylaminocoumarin)], benzoin isopropyl ether, 1-hydroxycyclohexyl phenyl ketone, camphorquinone, and biimidazoles [e.g., 2,2-bis(o-chlorophenyl)-4,5,4', 5'-tetraphenyl-1,2'-biimidazole].

As examples of the photopolymerization initiator, it may include benzoin isopropyl ether, 2-methyl-[4-(methylthio) phenyl]-2-morpholino-1-propanone, 1-phenyl-1,2-butanedione-2-(o-methoxycarbonyl)oxime, N-phenylglycine and 3-phenyl-5-isoxazolone.

These sensitizer and photopolymerization initiator described above may each be used alone or in combination of two or more thereof.

In the photosensitive resin composition of the present invention, the component (B) may be mixed in an amount of generally from 0.01 to 20 parts by weight, preferably from 0.1 to 10 parts by weight, and more preferably from 0.5 to 5 parts by weight, based on 100 parts by weight of the component (A). If the component (B) is in a too small amount, the composition may have a low photopolymerizability. If on the other hand it is in a too large amount, the composition may also have a low photopolymerizability, and may have a low storage stability.

(C) Organic Solvent

As the organic solvent (C), it is preferable to use an organic solvent which is selected from the same organic solvents exemplified above for use in synthesizing the polyimide precursors.

Any of these may be used alone or in combination of two or more thereof.

In the photosensitive resin composition of the present invention, the organic solvent may be so mixed that the polyimide resin (A) is in an amount of generally from 3 to 70% by weight, and preferably from 5 to 50% by weight, based on the total weight of the resin (A) and the solvent (C).

Other Additives

In the photosensitive resin composition of the present invention, additives such as a polymerization inhibitor may optionally be mixed in addition to the components (A) to (C).

Preparation of Composition and Cured Product

The photosensitive resin composition of the present invention can be readily obtained by uniformly mixing the above components (A) to (C) optionally together with other additives. The resultant composition may have a viscosity of generally from 100 to 20,000 centipoise at 25° C., in view of coating properties on substrates and workability.

The composition thus obtained is used, e.g., in the following way. First, the composition is coated on a substrate such as silicone wafer, metal, glass or ceramic by a known process such as spin coating, dip coating or printing. The coating thus formed is prebaked usually at a temperature of from 30 to 180° C. for 1 minute to 1 hour by a heating means such as a dryer or a hot plate to remove the organic solvent in the coating. Thus, a coating film is obtained.

Next, the coating film obtained is exposed to light such as visible light or ultraviolet light from an exposure device through a mask having a desired pattern. After the exposure, unexposed areas are dissolved and removed using a developer to form a relief pattern. As the developer, it may include, e.g., the solvents exemplified for the organic solvent (C). The developer may be used alone or in combination of two or more thereof.

The relief pattern thus formed is heated at a temperature of generally from 150 to 30° C., and preferably from 180 to 250° C. for 30 minutes to 4 hours by a heating means such as a dryer or an electric furnace, to evaporate off the remaining organic solvent, sensitizer, photopolymerization initiator and so forth. Thus, a pattern consisting of a film of the polyimide resin is obtained.

The photosensitive resin composition of the present invention has a good photosensitivity also when, e.g., thick films of 10 to 20 μm thick are formed. The resulting films contain no ionic impurities and also have superior heat resistance, mechanical properties and electrical properties. Thus, it is suited for protective insulating films for electronic parts, as exemplified by junction coat films, passivation films, and buffer coat films, which are present on the surfaces of semiconductor devices such as diodes, transistors, IC and LSI; α-ray-screening films of LSI or the like; interlayer-insulating films for multi-layer wiring; conformal coats of printed-circuit boards; orientation films for liquid-crystal display devices; and masks for ion implantation.

EXAMPLES

The present invention will be described below in greater detail with reference to Examples.

Preparation of a Polyimide Resin (A) Solution

Synthesis Example 1

Into a flask having a stirrer, a thermometer, a nitrogen-replacing device and an ester adapter, 44.42 g of 2,2-bis(3,4-benzenedicarboxylic anhydride) perfluoropropane and 275 g of cyclohexanone as a solvent were charged. To the solution obtained, 27.00 g of a polysiloxanediamine having —NH$_2$ at both terminals of its divalent group where b in the general formula (VI) was 9.8 (an average value) was dropwise added with stirring, and subsequently a solution prepared by dissolving 25.62 g of 2,2-bis(3-hydroxy-4-aminophenyl)-1,1,1,3,3,3-hexafluoropropane in 100 g of cyclohexanone was dropwise added. After the addition was completed, stirring was continued for further 10 hours. Thereafter, to the resultant reaction mixture, 50 g of toluene was added and the reaction system was heated to 150° C. At this stage, 3.5 g of water was recovered through the ester adapter. After the heating was completed, the reaction mixture was cooled to room temperature to obtain a solution containing a polyimide resin having a structure represented by the formula (a):

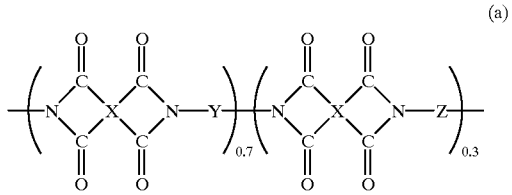

wherein X is a tetravalent group represented by the following formula:

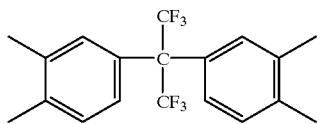

Y is a divalent group represented by the following formula:

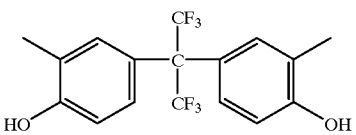

and Z is a divalent group represented by the following formula:

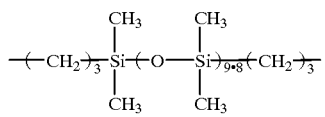

In IR spectral analysis of this resin, any absorption originating from polyamic acid was not observed, but absorptions based on imide groups were observed at 1,780 cm$^{-1}$ and 1,720 cm$^{-1}$ and an absorption originating from phenol groups was observed at about 3,400 cm$^{-1}$. Also, as a result of analysis by gel permeation chromatography using tetrahydrofuran as a solvent, the resin had a weight-average molecular weight of 45,000 in terms of polystyrene.

Into a flask, 330 g of the resin solution thus obtained and 10.4 g of methacrylic acid chloride were charged, and 10.1 g of triethylamine was further added, followed by stirring to effect esterification. Thus, about 70 mol % of the hydrogen atoms of the phenolic hydroxyl groups in the formula (a) was substituted with methacryloyl groups. The resultant resin solution (resin content: about 21% by weight) was designated as resin solution A-1, and was used in Examples described later.

Synthesis Example 2

Into a flask having a stirrer, a thermometer, a nitrogen-replacing device and an ester adapter, 8.83 g of 3,4,3',4'-biphenyltetracarboxylic anhydride, 29.82 g of 1,3-bis(3,4-dicarboxyphenyl)-1,1,3,3-tetramethyldisiloxane dianhydride and 280 g of N-methyl-2-pyrrolidone as a solvent were charged. To the solution obtained, 28.62 g of polysiloxanediamine having —NH$_2$ at both terminals of its divalent group where b in the general formula (VI) was 75 on average was dropwise added with stirring, and subsequently a solution prepared by dissolving 18.3 g of 2,2-bis(3-hydroxy-4-aminophenyl)-1,1,1,3,3,3-hexafluoropropane and 13.15 of 1,3-bis(3-aminophenoxy)benzene in 100 g of N-methyl-2-pyrrolidone was dropwise added. After the addition was completed, stirring was continued for further 10 hours. Thereafter, to the resultant reaction mixture, 50 g of toluene was added and the reaction system was heated to 150° C. At this stage, 3.6 g of water was recovered through the ester adapter. After the heating was completed, the reaction mixture was cooled to room temperature to obtain a solution containing a resin having a structure represented by the following formula (b) and a weight-average molecular weight of 82,000.

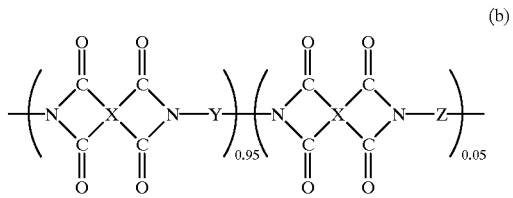

(b)

wherein X is a tetravalent group represented by the following formula:

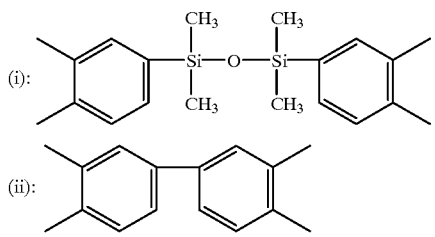

where (i)/(ii) is 70/30;

Y is a divalent group represented by the following formula:

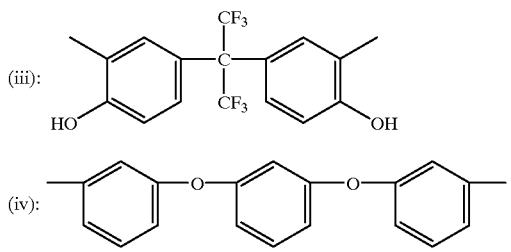

where (iii)/(iv) is 50/45; and

Z is a divalent group represented by the following formula:

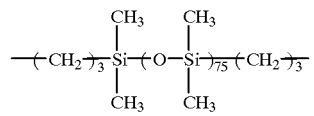

(In the Above, (i)/(ii) and (iii)/(iv) Represent Molar Ratios)

Into a flask, 475 g of the resin solution thus obtained and 10.4 g of methacrylic acid chloride were charged, and 10.1 g of triethylamine was further added at room temperature, followed by stirring to effect esterification. Thus, 100 mol % of the hydrogen atoms of the phenolic hydroxyl groups in the formula (b) was substituted with methacryloyl groups. The resultant resin solution (resin content: about 21% by weight) was designated as resin solution A-2, and was used in Examples described later.

Synthesis Example 3

Into a flask having a stirrer, a thermometer, a nitrogen-replacing device and an ester adapter, 15.51 g of 4,4'-oxyphthalic anhydride, 21.30 g of 1,3-bis(3,4-dicarboxyphenyl)-1,1,3,3-tetramethyldisiloxane dianhydride and 240 g of cyclohexanone as a solvent were charged. To the solution obtained, 16.20 g of polysiloxanediamine having —NH$_2$ at both terminals of its divalent group where b in the general formula (VI) was 9.8 (an average value), 22.99 g of 2,2-bis[4-(4-aminophenoxy)phenyl] propane and 11.45 g of polysiloxanediamine where b in the general formula (VI) was 75 (an average value) were dropwise added with stirring, and subsequently a solution prepared by dissolving 5.19 g of 3,3'-dihydroxy-4,4'-diaminobiphenyl in 140 g of N-methyl-2-pyrrolidone was dropwise added. After the addition was completed, stirring was continued for further 10 hours. Thereafter, to the resultant reaction mixture, 50 g of toluene was added and the reaction system was heated to 150° C. At this stage, 3.6 g of water was recovered through the ester adapter. After the heating was completed, the reaction mixture was cooled to room temperature to obtain a solution containing a resin having a structure represented by the following formula (c) and a weight-average molecular weight of 23,000.

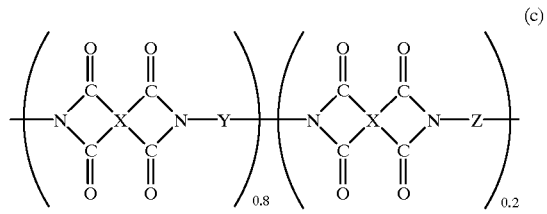

wherein X is a tetravalent group represented by the following formula:

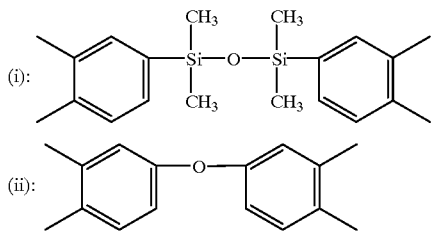

where (i)/(ii) is 50/50;
Y is a divalent group represented by the following formula:

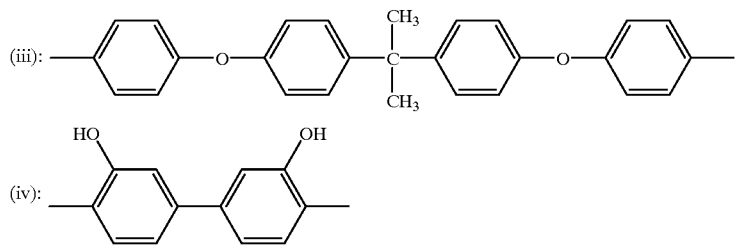

where (iii)/(iv) is 56/24; and
Z is a divalent group represented by the following formula:

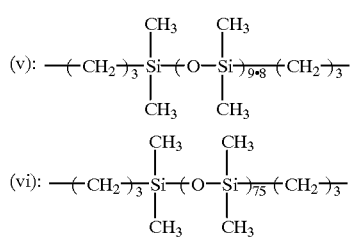

where (v)/(vi) is 18/2.
(In the Above, (i)/(ii), (iii)/(iv) and (v)/(vi) Represent Molar Ratios)

Into a flask, 430 g of the resin solution thus obtained and 4.5 g of acrylic acid chloride were charged, and 5.0 g of triethylamine was further added, followed by stirring to effect esterification. Thus, 100 mol % of the hydrogen atoms of the phenolic hydroxyl groups in the formula (c) was substituted with methacryloyl groups. The resultant resin solution (resin content: about 20% by weight) was designated as resin solution A-3, and was used in Examples described later.

Comparative Synthesis Example 1

In the same manner as in Synthesis Example 1, 44.42 g of 2,2-bis(3,4-benzenedicarboxylic anhydride) perfluoropropane and 250 g of cyclohexanone as a solvent were charged. To the solution obtained, 9.0 g of siloxanediamine (one having —NH$_2$ at both terminals of the divalent group in the general formula (VI) where b was 9.8 on average) was dropwise added with stirring, and subsequently a solution prepared by dissolving 7.32 g of 2,2-bis(3-hydroxy-4-aminophenyl)-1,1,1,3,3,3-hexafluoropropane and 28.74 g of 2,2-bis[4-(4-aminophonoxy)phenyl]propane in 100 g of cyclohexanone was dropwise added. Thereafter, the resin was imidized in the same manner as in Synthesis Example 1. At this stage, 3.6 g of water was recovered. The polyimide resin obtained was a resin having a structure represented by the formula (d):

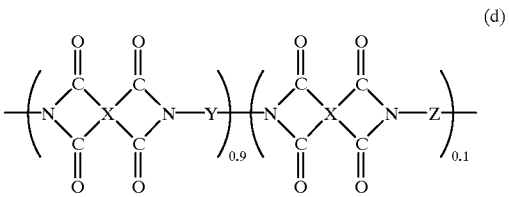

wherein X is a tetravalent group represented by the following formula:

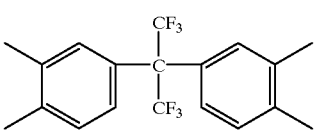

Y is a divalent group represented by the following formula:

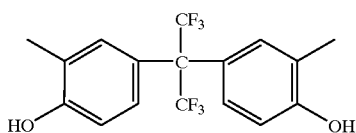
(i)

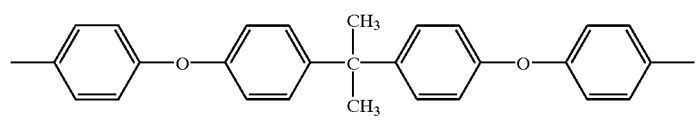
(ii)

where (i)/(ii) is 20/70; and

Z is a divalent group represented by the following formula:

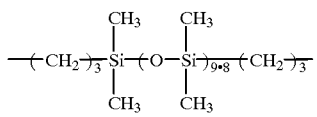

(In the Above, (i)/(ii) Represents a Molar Ratio)

Using 435 g of the solution thus obtained, 2.10 g of methacrylic acid chloride and 2.10 g of triethylamine, methacryloyl groups were introduced into 50 mol % of the hydroxyl groups of the resin. The resultant triethylamine hydrochloride was removed to obtain the intended resin solution A-4* (resin content: about 20% by weight). The weight-average molecular weight of the resultant resin was measured to find to be 42,000 in terms of polystyrene.

Comparative Synthesis Example 2

In the same manner as in Synthesis Example 1, 44.42 g of 2,2-bis(3,4-benzenedicarboxylic anhydride) perfluoropropane and 220 g of N-methyl-2-pyrrolidone as a solvent were charged. To the solution obtained, 13.6 g of an N-methyl-cyclohexanone solution in which 18.3 g of 2,2-bis(3-hydroxy-4-aminophenyl)-1,1,1,3,3,3-hexafluoropropane and 20.53 g of 2,2-bis[4-(4-aminophenoxy)phenyl]propane were dissolved was dropwise added. Thereafter, the resin was imidized in the same manner as in Synthesis Example 1. With the imidization, 3.6 g of water was recovered. The polyimide resin obtained was a resin having a structure represented by the formula (e):

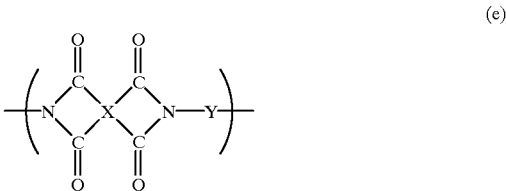
(e)

wherein X is a tetravalent group represented by the following formula:

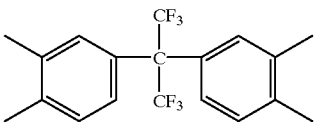

and Y is a divalent group represented by the following formula:

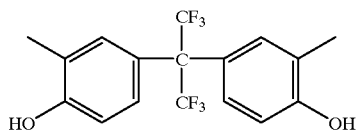
(i)

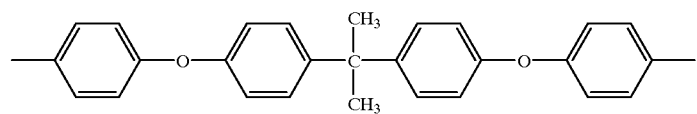
(ii)

where (i)/(ii) is 50/50.

(In the Above, (i)/(ii) Represents a Molar Ratio)

Using 313 g of the solution thus obtained, 5.23 g of methacrylic acid chloride and 5.3 g of triethylamine, methacryloyl groups were introduced into 50 mol % of the hydroxyl groups of the resin. The resultant triethylamine hydrochloride was removed to obtain the intended resin solution A-5* (resin content: about 20% by weight). The weight-average molecular weight of the resultant resin was measured to find to be 58,000 in terms of polystyrene.

Examples 1 to 4. Comparative Example 1 and 2

In each example, the resin solution obtained in Synthesis Example or Comparative Synthesis Example and the component (B) were mixed in a proportion as shown in Table 1 ["part(s)" is "part(s) by weight"] to prepare a composition. Photopolymerization initiators or sensitizers α to η used as the component (B) are compound shown below.

α: ethyl 4-diethylaminobenzoate
β: diethylaminoethyl methacrylate
γ: 2,6-bis-(4-diethylaminobenzal)-4-methyl-cyclohexanone
δ: carbonylbis(diethylaminocoumarin)
ε: N-phenylglycine
ζ: 3-phenyl-5-isooxazolone
η: 2,2-bis(o-chlorophenyl)-4,5,4', 5'-tetraphenyl-1,2'-biimidazole The compositions thus obtained were each coated on a silicone wafer using a spin coater, followed by drying at 90° C. for 4 minutes on a hot plate. With the coating film thus formed, a photomask having a stripe pattern was brought into close contact, followed by exposure to ultraviolet rays for 60 seconds, which were emitted from a 250 W ultra-high pressure mercury lamp.

Next, development was carried out for 30 seconds using a solution consisting of N-methyl-2-pyrrolidone/xylene=50/50 (weight ratio). The shape and minimum line width of line- and-space patterns thus formed were examined to evaluate photosensitivity. Results obtained are shown in Table 1.

The line-and-space patterns obtained in the above were heat-cured in a dryer at 150° C. for 0.5 hour and further at 200° C. for 1 hour. Next, the cured patterns were left for 24 hours in a pressure cooker of 2 atmospheric pressure, and thereafter their adhesion to substrates were examined according to the cross-cut peel test (JIS K5400). Results obtained are shown together in Table 1.

TABLE 1

|  |  | Composition |  | Photosensitivity |  | Adhesion Cross- | Cured-film |
|---|---|---|---|---|---|---|---|
|  |  | Resin solution (part) | Component (B) (part) | Pattern shape | Resolution (μm) | cut peel test results | thickness (μm) |
| Example | 1 | A-1 100 | α 1.5 δ 0.4 ε 1.5 | Good | 40 | 0/100 | 12 |
|  | 2 | A-1 100 | β 1.2 τ 0.3 η 1.2 | Good | 50 | 0/100 | 11 |
|  | 3 | A-2 100 | β 1.2 δ 0.3 ζ 1.2 | Good | 40 | 0/100 | 15 |
|  | 4 | A-3 100 | β 1.3 δ 0.3 η 1.3 | Good | 60 | 0/100 | 8 |
| Comparative Example | 1 | A-4* 100 | α 1.5 δ 0.4 ε 1.5 | No pattern formed | — | — | — |
|  | 2 | A-5* 100 | α 1.5 δ 0.4 ε 1.5 | Good | 60 | 100/100 | 10 |

What is claimed is:
1. A photosensitive resin composition comprising;

(A) a polyimide resin having a weight-average molecular weight of from 5,000 to 150,000, represented by the general formula (I):

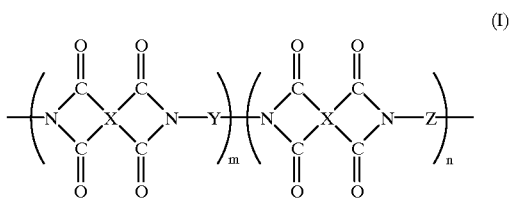

(I)

wherein X is at least one tetravalent organic group selected from the group consisting of groups represented by the following formulas (II-1) to (II-4):

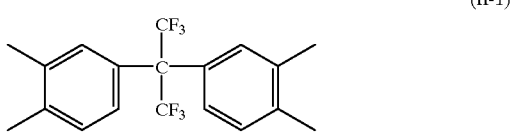

(II-1)

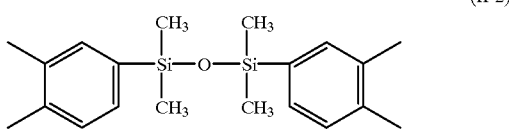

(II-2)

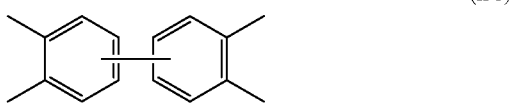

(II-3)

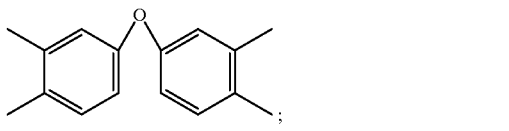

(II-4)

Y is a group comprised of 1) from 30 to 100 mol % of a divalent organic group represented by the general formula (III):

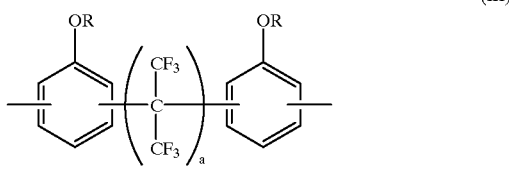

(III)

wherein a is an integer of 0 or 1, R's are independently an acryloyl group, a methacryloyl group or a hydrogen atom, provided that 50 mol % or more of the whole R's is at least one group selected from the group consisting of the acryloyl group and the methacryloyl group, and 2) from 70 to 0 mol % of a divalent organic group represented by the general formula (IV):

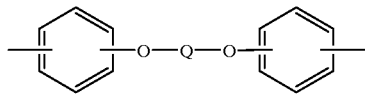

wherein Q is a divalent organic group selected from the group consisting of groups represented by the following formulas (V-1) to (V-3):

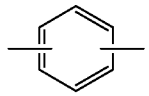

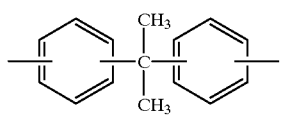

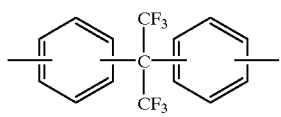

Z is a divalent organic group represented by the following general formula (VI):

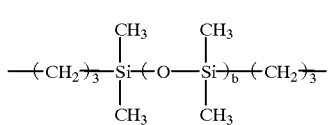

wherein b is an integer of 5 to 80; and
   m and n each represent the number of structural units to which the m and n are attached respectively, provided that m/(m+n) is 0.98 to 0.70 and n/(m+n) is 0.02 to 0.30;
(B) an agent selected from the group consisting of a sensitizer and a photopolymerization initiator; and
(C) an organic solvent.

2. The composition of claim 1, wherein in the component (A) said organic group of the general formula (III) is at least one member selected from the group consisting of a radical formed by removing two amino groups from 3,3'-dihydroxy-4,4'-diaminobiphenyl, a radical formed by removing two amino groups from 2,2-bis(3-hydroxy-4-aminophenyl)-1,1,1,3,3,3-hexafluoropropane, and groups formed by substituting at least part of the hydrogen atoms of the phenolic hydroxyl group of these radicals with at least one group selected from the group consisting of an acryloyl group and a methacryloyl group.

3. The composition of claim 1, wherein in the component (A) said organic group of the general formula (IV) is at least one member selected from the group consisting of a radical formed by removing two amino groups from 1,4-bis(3-aminophenoxy)benzene, a radical formed by removing two amino groups from 1,4-bis(4-aminophenoxy)benzene, a radical formed by removing two amino groups from 2,2-bis[4-(4-aminophenoxy)phenyl]propane, and a radical formed by removing two amino groups from 2,2-bis[4-(4-aminophenoxy)phenyl]perfluoropropane.

4. The composition of claim 1, wherein the component (B) is in an amount of from 0.01 to 20 parts by weight based on 100 parts by weight of the component (A), and the component (A) is in such an amount that the component (A) is in an amount of from 3 to 70% by weight based on the total of the components (A) and (C).

5. The composition of claim 1, wherein in the component (A) of the general formula (I), the divalent organic groups represented by the general formulas (III) and (IV) to be held in the whole R groups are in a proportion of from 50 to 100 mol % and from 50 mol % to 0 mol %, respectively; the one group selected from the group consisting of the acryloyl group and methacryloyl group to be held in the whole R groups of the general formula (III) is in a proportion of from 70 to 100 mol %; b in the divalent organic group of the general formula (VI) is an integer of from 7 to 75; and m is a number satisfying that m/(m+n) is 0.98 to 0.85 and n is a number satisfying that n/(m+n) is 0.02 to 0.15.

* * * * *